(12) United States Patent
Douskey et al.

(10) Patent No.: US 7,949,918 B2
(45) Date of Patent: May 24, 2011

(54) ASYNCHRONOUS COMMUNICATION USING STANDARD BOUNDARY ARCHITECTURE CELLS

(75) Inventors: Steven Michael Douskey, Rochester, MN (US); Michael John Hamilton, Rochester, MN (US); Brandon Edward Schenck, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 370 days.

(21) Appl. No.: 12/178,833

(22) Filed: Jul. 24, 2008

(65) Prior Publication Data

US 2010/0023821 A1    Jan. 28, 2010

(51) Int. Cl.
  *G01R 31/28* (2006.01)
(52) U.S. Cl. .................................. 714/727; 714/724
(58) Field of Classification Search .................. 714/727, 714/726, 729, 724, 733, 734, 30
See application file for complete search history.

(56) References Cited

U.S. PATENT DOCUMENTS

| | | |
|---|---|---|
| 5,490,097 A | 2/1996 | Swenson et al. |
| 6,115,763 A | 9/2000 | Douskey et al. |
| 6,145,100 A | 11/2000 | Madduri |
| 6,519,729 B1 | 2/2003 | Whetsel |
| 6,539,491 B1 | 3/2003 | Skergan et al. |
| 6,728,915 B2 | 4/2004 | Whetsel |
| 6,948,147 B1 | 9/2005 | New et al. |
| 7,013,415 B1 | 3/2006 | Kamei et al. |
| 7,032,146 B2 | 4/2006 | Ayers, Sr. |
| 7,085,706 B1 | 8/2006 | McGettigan et al. |
| 7,284,170 B2 | 10/2007 | Whetsel |
| 7,322,000 B2 | 1/2008 | Colunga et al. |
| 7,480,843 B1 | 1/2009 | Jacobson |
| 7,538,574 B1 * | 5/2009 | Tang et al. ................. 326/38 |
| 7,627,797 B2 | 12/2009 | Miner et al. |
| 7,737,723 B1 * | 6/2010 | Tang et al. ................. 326/38 |
| 2005/0204225 A1 | 9/2005 | Whetsel |
| 2006/0236174 A1 | 10/2006 | Whetsel |
| 2007/0101217 A1 | 5/2007 | Whetsel, Jr. et al. |
| 2007/0288820 A1 | 12/2007 | Whetsel |
| 2008/0005633 A1 | 1/2008 | Whetsel |

OTHER PUBLICATIONS

Non-Final Office Action for U.S. Appl. No. 12/178,776 mailed Jun. 7, 2010, 6 pages.

* cited by examiner

*Primary Examiner* — Phung M Chung
(74) *Attorney, Agent, or Firm* — Toler Law Group (57) ABSTRACT

An adaptation of standard boundary cell architecture defined by the IEEE 1149.1 Joint Test Action Group (JTAG) interface standard to provide paths to functional circuitry via the re-use of JTAG standard test data registers (TDR) and interface. Existing multi-core processor solutions are covered, but an expansion for a more generic solution is provided. In general, an integrated circuit is provided with a plurality of function registers along with a plurality of I/O units. The I/O units are arranged in a serial communications chain located around the boundary of the integrated circuit's functional circuitry. Each of the I/O units include JTAG standard serial TDR in serial communication with adjacent I/O units. Moreover, each I/O unit includes JTAG standard parallel TDR that is associated with and in parallel communication with the I/O unit's JTAG standard serial TDR. Further still, a digital logic interface is configured to control the direct transfer of data between the JTAG standard parallel TDR and a corresponding one of the plurality of function registers. As a result of the re-use of existing boundary scan architecture, a significant reduction in wiring congestion is realized. Thus, asynchronous communication is provided without sacrificing valuable integrated circuit real estate.

20 Claims, 5 Drawing Sheets

ASYNCHRONOUS COMMUNICATION USING STANDARD BOUNDARY ARCHITECTURE CELLS

RELATED APPLICATIONS

The present application relates to co-pending U.S. patent application Ser. No. 12/178,776, entitled "Asynchronous Communication Apparatus Using JTAG Test Data Registers" by the present inventors, Steven Michael Douskey, Michael John Hamilton, and Brandon Edward Schenck. The co-pending application is filed concurrently herewith, and is incorporated by reference in its entirety.

FIELD OF THE INVENTION

The present invention generally relates to the IEEE 1149.1 Joint Test Action Group (JTAG) standards, and more particularly, to facilitating communications between circuit components using JTAG standards.

BACKGROUND OF THE INVENTION

The IEEE 1149.1 JTAG interface was developed to facilitate external access to integrated circuit devices. A JTAG-compatible integrated circuit device typically includes a standardized test access port (TAP) that allows boundary scan operations to be performed by an external TAP controller via the TAP port of the device. All test result outputs may be sent back through the same TAP port.

The standardized JTAG interface originally was used to test printed circuit boards and later found use in testing individual integrated circuits. However, due to their complexity, core-based integrated circuit design has introduced new complexities in that the number of transistors has increased at a greater rate than Input/Output (I/O) pins. Therefore, standard test data register (TDR) cells have been developed that may be grown directly on the integrated circuit. Thus, cell-based TDRs may be placed generally wherever they are needed along the boundary of the integrated circuit's functional circuitry boundary. For the purposes of this disclosure, a cell-based integrated circuit design may be implemented by a circuit designer that lays out an integrated circuit design by connecting together a number of predefined cells. Each cell may include a plurality of transistors that have been integrated together to perform a predefined function. Cells may be maintained in a library, so that a designer may often build a design simply by assembling together cells of transistors rather than laying out each transistor individually.

Conventional designs implement a full Scan Communications bus (SCom) with a unique protocol to handle the debug logic needed for communication. However, the SCom solution, having a similar register addressed structure, has an additional level of clock latency, as well as similar global wiring and area congestion issues.

What is consequently needed is an asynchronous communication mechanism that allows a user to implement their unique internal register-addressed protocol, typically at a chip system speed, and allows data to be asynchronously transferred to and from a JTAG controller at the JTAG interface speed.

SUMMARY OF THE INVENTION

The present invention provides an improved computer implemented method and apparatus for extending the IEEE 1149.1 JTAG standard for communicating with functional circuitry through the re-use of JTAG standard boundary cell architecture, the apparatus comprising an integrated circuit having a plurality of function registers associated with the integrated circuit's functional circuitry, and a plurality of I/O units arranged in a serial communications chain that is located around the boundary of the integrated circuit's functional circuitry. Each I/O unit comprises at least one JTAG standard serial TDR in serial communication with adjacent I/O units, at least one JTAG standard parallel TDR associated with and in parallel communication with the at least one JTAG standard serial TDR, and digital logic configured to control the direct transfer of data between the at least one JTAG standard parallel TDR and a corresponding one of the plurality of function registers.

An embodiment consistent with the invention may comprise a JTAG standard parallel TDR that includes data bits for representing data to be written or read from its associated function register. The JTAG standard parallel TDR may include a READ/WRITE bit for indicating the direction of data flow. A DATA GOOD signal having a timing delay that is sufficient to guarantee the data represented by the data bits is stable may also be included.

Aspects of the invention may include a JTAG standard parallel TDR comprising address bits for addressing its associated function register. Embodiments consistent with the invention may include an ADDRESS VALID bit for indicating the correctness of the values held by the at least one JTAG standard parallel TDR address bits. An extended boundary scan signal that is inactive during the execution of JTAG standard instructions for maintaining IEEE 1149.1 compliance may be active during execution of extended functional instructions. The extended boundary scan signal may be an inversion of a logical OR of standard boundary scan instructions.

According to another aspect of the invention, a method is disclosed for extending the IEEE 1149.1 JTAG standard for communicating with functional circuitry through the re-use of JTAG standard boundary cell architecture, the method comprising steps of providing an integrated circuit having a plurality of function registers associated with the integrated circuit's functional circuitry, and providing a plurality of Input/Output units arranged in a serial communications chain that is located around the boundary of the integrated circuit's functional circuit. Each I/O unit may comprise at least one JTAG standard serial TDR in serial communication with adjacent I/O units, at least one JTAG standard parallel TDR associated with and in parallel communication with the at least one JTAG standard serial TDR, and a digital logic interface configured to control the direct transfer of data between the at least one JTAG standard parallel TDR and a corresponding one of the plurality of function registers.

Processes consistent with embodiments of the invention may further include steps for reading data from a selected one of the plurality of function registers, the method steps comprising issuing a JTAG instruction to select a desired one of the plurality of Input/Output units, shifting the address of the readable data into the at least one JTAG standard boundary scan serial TDR of the selected Input/Output unit, loading the address of the readable data from the at least one JTAG standard boundary scan serial TDR into the at least one JTAG standard boundary scan parallel data register, setting a corresponding ADDRESS VALID bit once address loading is complete, loading the readable data from the at least one function register into the JTAG standard boundary scan serial TDR interfaced via the digital logic interface, shifting the data out of the plurality of Input/Output units, and testing a corresponding DATA GOOD signal until the readable data in the serial TDR is valid.

According to aspects of the invention, the ADDRESS VALID bit may be cleared after the DATA GOOD signal and address bits are cleared, and the DATA GOOD signal may be turned off after the ADDRESS VALID bit is cleared. Other processes consistent with the invention may include issuing a JTAG instruction to select a desired one of the plurality of Input/Output units, shifting the address of the writable data into the at least one JTAG standard serial TDR of the selected Input/Output unit, shifting the writable data into the at least one JTAG standard serial TDR of the selected Input/Output unit, loading the address of the writable data from the at least one JTAG standard serial TDR into the at least one JTAG standard parallel data register, setting a corresponding ADDRESS VALID bit once address loading is complete, loading the writable data from the at least one JTAG standard serial TDR into the at least one JTAG standard parallel data register, testing a corresponding DATA GOOD signal until the writable data in the JTAG standard parallel TDR is valid, and loading the writable data from the JTAG standard parallel TDR into the at least one function register via the second digital interface logic. Embodiments consistent with the invention may further include a step of providing a JTAG macro that orchestrates the overall communication process.

Another aspect of the invention may relate to an apparatus for extending the IEEE 1149.1 JTAG standard for communicating with functional circuitry through the re-use of JTAG standard boundary cell architecture. The apparatus may include an integrated circuit having a plurality of function registers associated with the integrated circuit's functional circuitry, and a plurality of I/O units arranged in a serial communications chain that is located around the boundary of the integrated circuit's functional circuitry. Each I/O unit may comprise at least one JTAG standard serial TDR in serial communication with adjacent I/O units, at least one JTAG standard parallel TDR having data bits for representing data to be written to or read from an associated one of the plurality of function registers, wherein the at least one JTAG standard parallel TDR is associated with and in parallel communication with the at least one JTAG standard serial TDR, and digital logic configured to control the direct transfer of data between the at least one JTAG standard parallel TDR and a corresponding one of the plurality of function registers.

Embodiments consistent with the invention may include a JTAG standard parallel TDR comprising a READ/WRITE bit for indicating the direction of data flow. A DATA GOOD signal may be included that has a timing delay that is sufficient to guarantee the data represented by the data bits is stable. The JTAG standard parallel TDR may include address bits for addressing its associated function register. An ADDRESS VALID bit for indicating the correctness of the values held by the at least one JTAG standard parallel TDR address bits may also be included.

Aspects of the invention may include an extended boundary scan signal that is inactive during the execution of JTAG standard instructions for maintaining IEEE 1149.1 compliance and active during execution of extended functional instructions. The extended boundary scan signal may be an inversion of a logical OR of standard boundary scan instructions.

These and other advantages and features that characterize the invention are set forth in the claims annexed hereto and forming a further part hereof. However, for a better understanding of the invention, and of the advantages and objectives attained through its use, reference should be made to the Drawings and to the accompanying descriptive matter in which there are described exemplary embodiments of the invention.

DETAILED DESCRIPTION

Embodiments consistent with the invention allow for general purpose I/O communication through a standard JTAG interface without altering standard JTAG functions. In particular, aspects of the present invention provides asynchronous communication between a JTAG macro and a customer's integrated circuit communication logic.

Embodiments consistent with the invention adapt a standard boundary cell architecture defined by the JTAG interface standard to provide paths to functional circuitry via the re-use of JTAG standard TDR and interface. Existing multi-core processor solutions may be included, and an expansion for a more generic solution may be provided. In general, an integrated circuit may be provided with a plurality of function registers along with a plurality of I/O units. The I/O units are arranged in a serial communications chain located around the boundary of the integrated circuit's functional circuitry. Each of the I/O units may include JTAG standard serial TDR in serial communication with adjacent I/O units. Moreover, each I/O unit includes JTAG standard parallel TDR that is associated with and in parallel communication with the I/O unit's JTAG standard serial TDR.

Further, a digital logic interface is configured to control the direct transfer of data between the JTAG standard parallel TDR and a corresponding one of the plurality of function registers. As a result of the re-use of existing boundary scan architecture, a significant reduction in wiring congestion is realized. Thus, asynchronous communication is provided without sacrificing valuable integrated circuit real estate.

More particularly, embodiments consistent with the present invention adapt a TDR structure defined by the IEEE 1149.1 JTAG interface standard to provide a debugging path. Aspects of the invention may include existing multi-core processor solutions, but have been expanded for a more generic solution, and further expanded to re-use existing Boundary scan TDR logic to reduce area and wiring congestion.

Embodiments of the present invention provide an interface that is an extension to the IEEE 1149.1 JTAG standard that allows for an asynchronous protocol into the user's (i.e., customer's) existing logic. This new interface is implemented by adding several TDRs that communicate with customer addressed registers within their core logic. In particular, the 1149.1 JTAG TAP controller is used, with additional synchronization logic, to provide an extendable interface that does not alter the standard JTAG functions.

Embodiments of the present invention introduce new serial TDR with one or more matching parallel TDRs. A serial TDR may be loaded with data in a serial manner, and a parallel TDR may be loaded with data in a parallel manner. All address and data flow to the customer logic may be through these TDRs and back into a JTAG macro that orchestrates the overall communication process.

A provided ADDRESS parallel TDR may reserve two bits for READ/WRITE control and ADDRESS VALID bits. A DATA parallel TDR may be provided to hold data that is to be written into the customer logic during data write sequences. These two TDRs may optionally be combined into one larger register. A third register within the customer logic may be used to hold the read data from the customer logic. An additional bit of this third register serves as a DATA GOOD flag. The DATA GOOD indicator includes a timing delay that is sufficient to guarantee the read data is stable, thus correct. Customer logic on the customer's integrated circuit core typically operates at a clock speed that is different than the JTAG interface. Therefore, care may be taken to capture any external TDR contents correctly. Since the address, read/write bit, and the data (during a data write sequence) are set up in advance, only the ADDRESS VALID bit may be synchronized to the customer's core clock.

The following steps involving communications handshaking are taken during a typical data write operation according to an embodiment of the present invention: first, data may be loaded into a WRITE DATA Register, ADDRESS Register along with setting of the READ/WRITE bit to logic zero during an UPDATE-DR state of the TAP controller. Second, the ADDRESS VALID bit is set to logic one at one TCK cycle later upon entering a RUN-TEST-IDLE state. Third, the ADDRESS VALID bit remains active until the TAP controller leaves the RUN-TEST-IDLE state, so it must be captured in customer logic before the later TCK cycle. Looping in the RUN-TEST-IDLE state may prolong the setup significantly, often because TCK is much slower than the functional clocks of the customer's core. The TDR DATA REGISTER, ADDRESS REGISTER and READ/WRITE bit may remain until a new instruction is loaded, but are assumed invalid when the ADDRESS VALID bit turns off. Fourth, once the ADDRESS VALID bit is captured synchronously in logic, the write is triggered to the appropriate register in the customer's integrated circuit.

The following steps involving communications handshaking are taken during a typical data read operation according to embodiments of the present invention: first, the ADDRESS Register is loaded with the address of the customer's register to be read along with setting of the READ/WRITE bit to logic one during an UPDATE-DR state of the TAP controller. Second, the ADDRESS VALID bit is set to logic one at one TCK cycle later upon entering a RUN-TEST-IDLE state. Third, the ADDRESS VALID bit remains active until the TAP controller leaves the RUN-TEST-IDLE state, so it must be captured in customer logic before the later TCK cycle. Looping in the RUN-TEST-IDLE state may prolong the setup significantly, often because TCK is much slower than the functional clocks of the customer's core. The TDR DATA REGISTER, ADDRESS REGISTER and READ/WRITE bit will remain until a new instruction is loaded, but are assumed invalid when the ADDRESS VALID bit turns off. Fourth, once the ADDRESS VALID bit is captured synchronously in logic, the read may be triggered. The addressed register in the customer's integrated circuit may present the READ data. Fifth, the READ DATA may be loaded into the TDR during the CAPTURE-DR state. If the DATA GOOD bit is not set to logic one, repeated loops through CAPTURE-DR may be made until it sets to logic one. Once DATA GOOD is set, the ADDRESS VALID bit (and optionally the ADDRESS register) may be cleared.

Variations in the communications handshaking design and sequencing may include, but are not limited to the following steps: first, WRITE DATA and ADDRESS may be loaded in two separate operations, though WRITE DATA should be loaded first. Second, WRITE DATA and ADDRESS may be captured in the customer's integrated circuit (i.e., chip domain) and later be written to the desired location. This process may remove much of the dependency on TCK. Third, the ADDRESS VALID bit may be loaded at the same time as the ADDRESS, but should be delayed by the customer's integrated circuit logic long enough to ensure valid capture of ADDRESS and WRITE DATA (at least as long as the longest ADDRESS and WRITE DATA delay path.

The TDR scheme described above may be implemented within standard boundary architecture cells. In function mode (customer logic is in mission mode), a boundary cell operates primarily as a pass-through device. That is, the latches in the serial and parallel paths (the Capture and Update latches, respectively) are not active during functional mode. Extra control signals may be repeated throughout an integrated circuit design to localize the sample and drive points. Similar structures may be easily added to most other existing boundary scan configurations as well.

In system mode, the functional data input may be selected to the data output path and feed the input/output pad driver. Similarly, the receive data may be selected from the read data input to read data output feeding the system's terminals. Test mode logic is inactive during system functions. The (DS serial and DP parallel) latches are available and may be safely used as a part of a new TDR register. In this way, input/output chip operations will not be corrupted. The test data input (TDI) and test data output (TDO) paths on serial registers (DS and ES) may be used as the TDR serial scan path. The parallel registers (DP and EP) are useable as Address and Write Data registers as well. The same read and write operations described previously are still valid here, but with the clock gating changes made to support this function and the regular Boundary Scan external test functions.

A new boundary scan control signal: MODE_E may be active during JTAG standard instructions involving boundary scan operations. Such JTAG standard instructions include, but are not limited to EXTEST, SAMPLE and PRELOAD. Moreover, this new signal may allow for a new private instruction or it may be the inversion of the logical OR of all other boundary scan instructions, while maintaining IEEE 1149.1 compliance.

With the larger number of latches available in the boundary scan ring, some of the parallel latches may be used to hold permanent write data (configuration data). Care may be taken to avoid disrupting these latches holding sensitive system control bits (PLL control settings, clock gates, etc.). Clocking is unique, as all parallel boundary latches must still respond in that mode. Each may include a unique TDR address for this new TDR mode. An update clock (UpdClk) signal may then be blocked, and this register holds TDR data, even when other sections of boundary scan are being updated with new TDR data. The Update clocks and Capture clocks may all include at least MODE_E in their gating.

Read and write operations typically sequence as described above. However, embodiments may be realized through the use of a longer serial TDR. Such a TDR may include multiple parallel TDRs, wherein each is individually addressable.

There are many advantages to reusing boundary scan for TDRs. One advantage is that valuable chip real estate is saved, since boundary scan logic already exists and is typically not used beyond initial chip testing. Moreover, boundary scan structures are common on chips. As a result of boundary scan's ubiquity, there are more than enough latches available to accommodate most TDR requirements. Since the placement of these structures is usually uniform across an integrated circuit, it also enables a designer to use boundary scan structures in close physical proximity to the logic it will read and write. This fact allows significant global routing savings. Further still, this logic is already fed by TCK based clocks, and only minor gating changes are required to implement this new design. Therefore, integrated circuits under development may use the global real estate savings provided by embodiments of the present invention with only minor changes to their netlists. Embodiments consistent with the present invention provide these extensions and enhancements while maintaining compliance with the IEEE 1149.1 JTAG standard.

Figure 1:
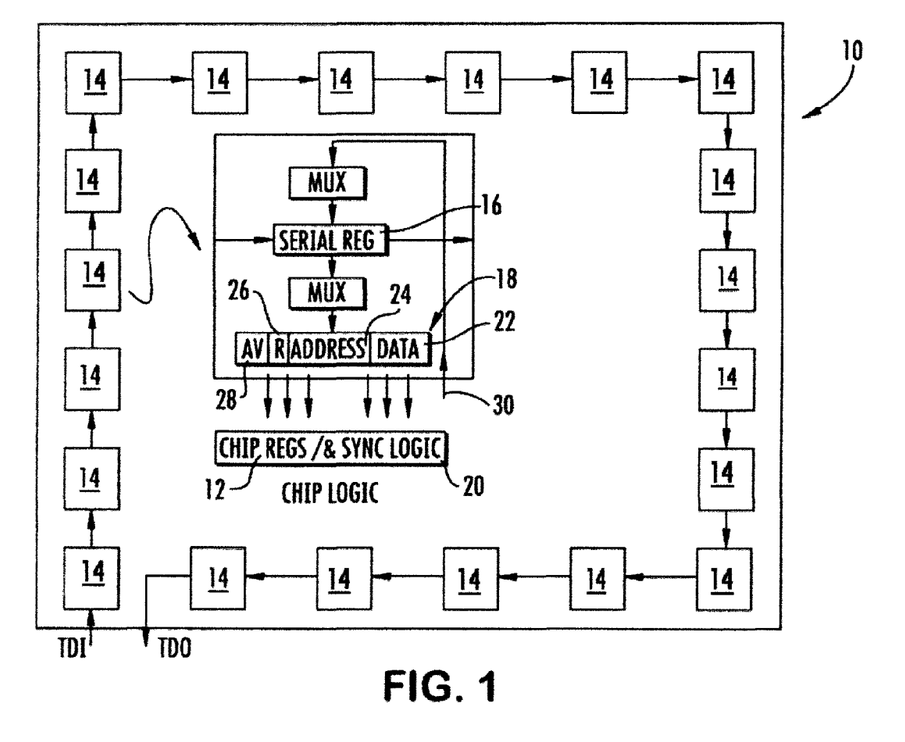
FIG. 1 shows a block diagram of a boundary cell architecture that is consistent with the principles of the present invention.

Turning now to the Drawings, wherein like numbers denote like elements throughout the several views, FIG. 1 illustrates a boundary scan architecture 10 placed on an integrated circuit. A plurality of function registers 12 and microchip logic 20 belong to the microchip domain that includes the integrated circuit's functional circuitry. A plurality of I/O (input/output) units 14 are arranged in a serial communications chain that is located around the boundary of the integrated circuit's functional circuitry. An enhanced JTAG cell stored in a library of cells may be used to lay out the plurality of I/O units 14 on the integrated circuit's substrate.

Figure 2:
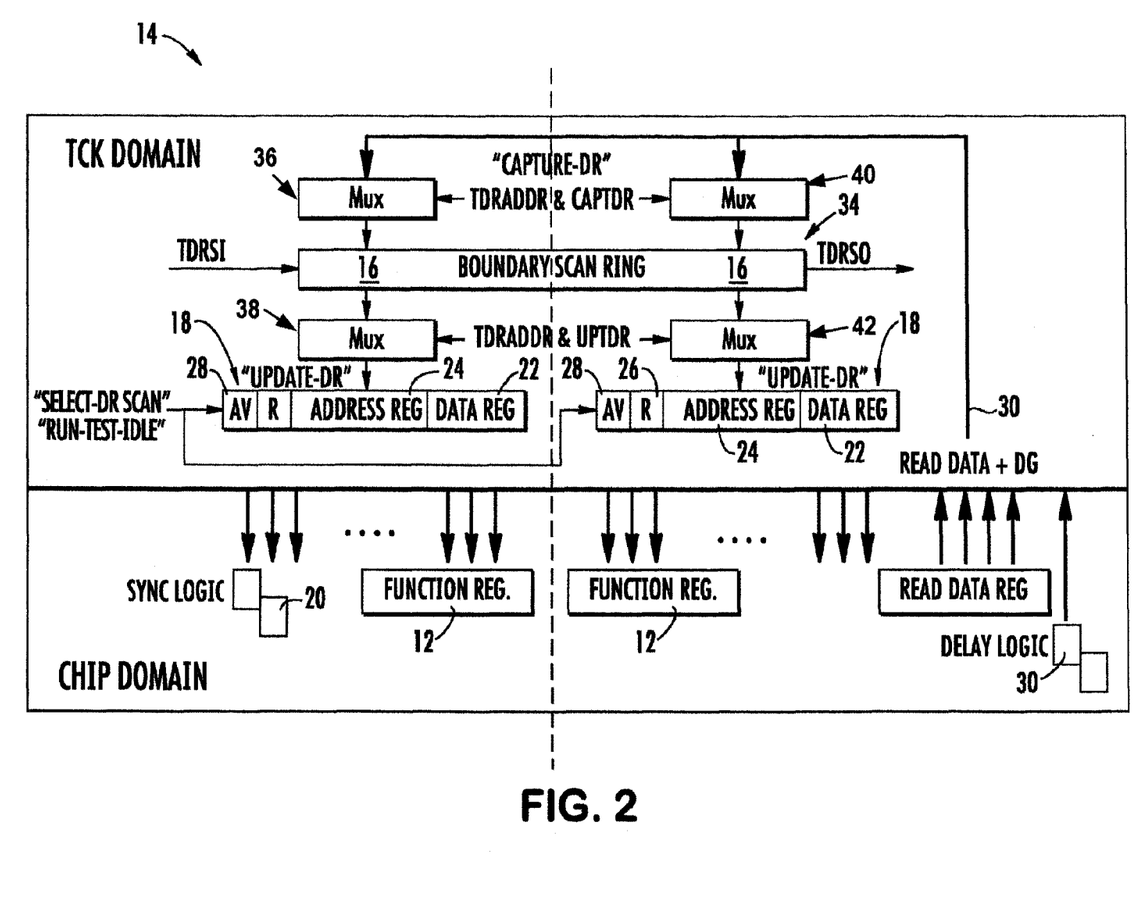
FIG. 2 shows an enhanced boundary scan architecture for allowing communication with functional circuitry in accordance with the underlying principles of the present invention.

As best illustrated in FIG. 2, each of the I/O units 14 may include a JTAG standard serial TDR 16 in serial communication with adjacent I/O units 14 and a JTAG standard parallel TDR 18, which is associated with and in parallel communication with the JTAG standard serial TDR 16. Each of the I/O units 14 may additionally include multiplexers 36, 38, 40, 42.

Digital logic 20 may be configured to control the direct transfer of data between the JTAG standard parallel TDR 18 and a corresponding one of the plurality of function registers 12. Moreover, the JTAG standard parallel TDR 18 includes data bits 22 for representing data to be written to or read from its associated function register 12. The JTAG standard parallel TDR 18 also includes address bits 24 for addressing its associated function register 12.

A READ/WRITE bit 26 for indicating the direction of data flow is also included with the JTAG standard parallel TDR 18. Further still, an ADDRESS VALID bit 28 is included for validating the correctness of the address held by address bits 24. Moreover, a DATA GOOD signal 30 is an indicator that has a timing delay that is sufficient to guarantee the read data is stable, and thus correct.

Figures 3, 4:
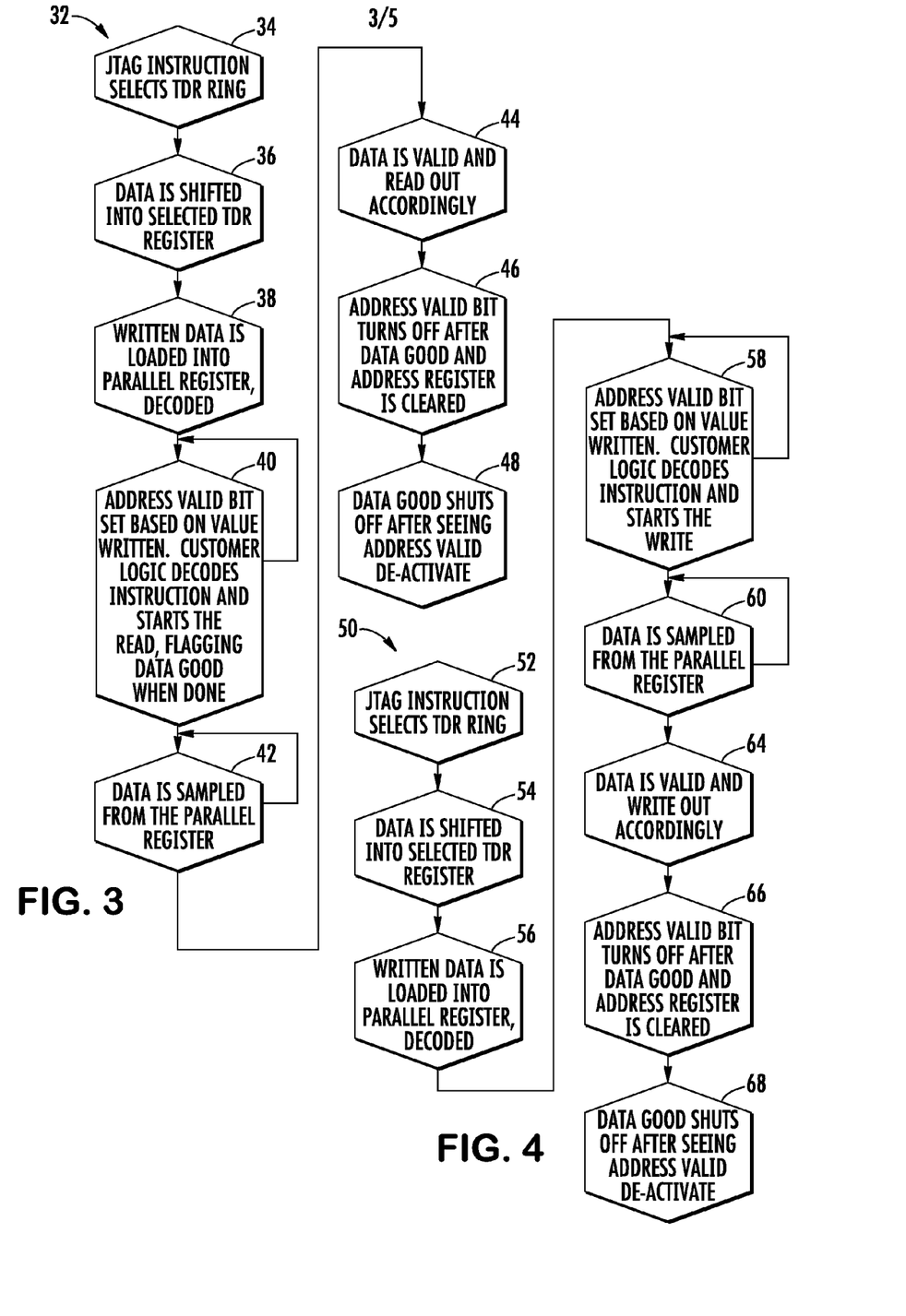
FIG. 3 is a flow chart showing the steps executed by the architecture of FIG. 2 for a read data sequence using communications handshaking in accordance with the underlying principles of the present invention.
FIG. 4 is a flow chart showing the steps executed by the architecture of FIG. 2 for a write data sequence using communications handshaking in accordance with the underlying principles of the present invention.

Turning now to FIGS. 3-6, processes consistent with embodiments of the present invention are illustrated. FIG. 3, more particularly, depicts a typical data read sequence 32 used to read data from an integrated circuit function register in accordance with the underlying principles of the present invention.

The read data sequence shown in the flowchart 32 of FIG. 3 includes communications handshaking processes consistent with embodiments of the invention. At block 34, a JTAG instruction may be issued to select a desired one of the plurality of I/O units associated with a TDR ring. At block 36, the system 10 proceeds by shifting the address of the readable data into the JTAG standard serial TDR 16 of the selected I/O unit. At block 38, the address of the readable data may be loaded from the JTAG standard serial TDR 16 into the JTAG standard parallel data register 18.

A loop through TAP states run-test-idle and shift-DR may be maintained while data is read to serial TDR 16 and shifted out to check DATA GOOD. These process may be retried as needed. Then at block 40, the state concludes with the setting of a corresponding ADDRESS VALID bit, once the address loading is complete. At block 42, the readable data may be loaded from the function register 12 into the JTAG standard serial TDR 16 interfaced via the digital logic interface shown in FIG. 1

Processes may continue at block 44, where the data is valid and read out. The system 10 may test a corresponding DATA GOOD signal until the readable data is valid. The readable data may be shifted out of the plurality of I/O units.

Communications handshaking may complete at blocks 46 and 48. More particularly, the system 10 may turn off at block 46 the ADDRESS VALID bit after the DATA GOOD indicator and the address bits are cleared. The system 10 at block 46 may shut off the DATA GOOD signal after seeing the ADDRESS VALID bit clear.

As shown in the flowchart 50 of FIG. 4, a write data sequence includes communications handshaking processes. At block 52, a JTAG instruction may select a desired one of the plurality of I/O units associated with a TDR ring. The system 10 may proceed at block 54 by shifting the address of the writeable data into the JTAG standard serial TDR 16 of the selected I/O unit. The address of the writeable data may be loaded at block 56 from the JTAG standard serial TDR 16 into the JTAG standard parallel data register 18.

A run-test-idle state may be maintained until at block 58 a corresponding ADDRESS VALID bit is set, once the address loading is complete. At block 60, writeable data may be loaded from the JTAG standard parallel TDR 18 into the function register 12 interfaced via the digital logic interface shown in FIG. 1

A corresponding DATA GOOD signal may be tested until the write data is complete at block 64.

Communications handshaking may conclude at blocks 66 and 68 of FIG. 4. Turning more particularly to block 66, the system 10 may turn off the ADDRESS VALID bit after the DATA GOOD indicator and the address bits are cleared. Finally, the DATA GOOD signal may be shut off after seeing the ADDRESS VALID bit clear.

Figure 5:
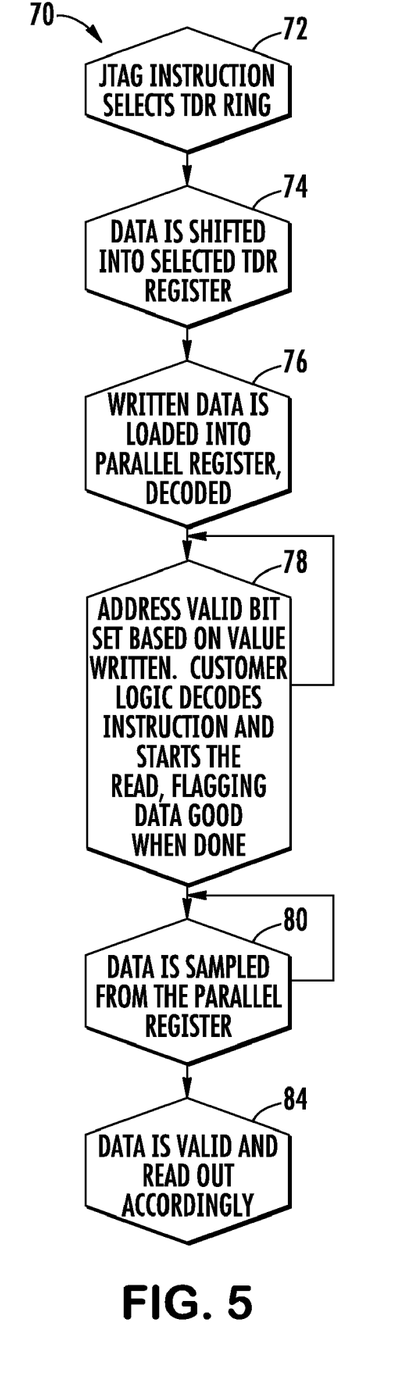
FIG. 5 is a flow chart showing the steps executed by the architecture of FIG. 2 for a read data sequence without using communications handshaking in accordance with the underlying principles of the present invention.

The flowchart 70 of FIG. 5 includes communications handshaking in accordance with the underlying principles of the present invention. At block 72, a JTAG instruction may be issued to select a desired one of the plurality of I/O units associated with a TDR ring. The system 10 may proceed at block 74 by shifting the address of the readable data into a JTAG standard serial TDR 16 of the selected I/O unit. At block 76, the address of the readable data may be shifted from the JTAG standard serial TDR 16 into the JTAG standard parallel TDR 18.

A run-test-idle state may be maintained until at block 78, the corresponding ADDRESS VALID bit is set, once the address loading is complete. At block 80, the system 10 may proceed by loading the readable data from a function register 12 into the JTAG standard serial TDR 16 interfaced via the digital logic interface, as shown in FIG. 1. A corresponding DATA GOOD signal may be tested until the readable data in the parallel TDR 18 is valid. The readable data may be shifted out of the plurality of I/O units.

Figure 6:
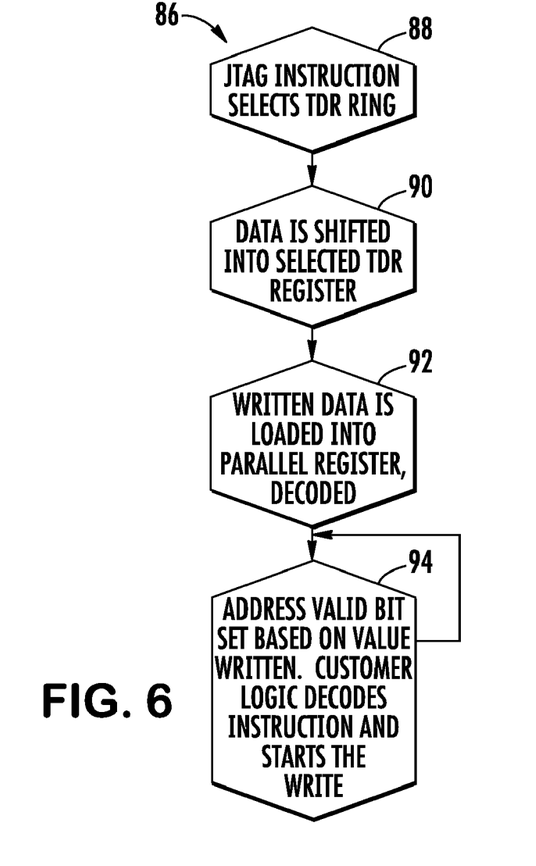
FIG. 6 is a flow chart showing the steps executed by the architecture of FIG. 2 for a write data sequence without using communications handshaking in accordance with the underlying principles of the present invention.

FIG. 6 is a flowchart 86 showing a write data sequence without communications handshaking in accordance with the underlying principles of the present invention. At block 88, a JTAG instruction may be issued to select a desired I/O unit associated with a TDR ring. At block 90, the system 10 may shift the address of the writeable data into the JTAG standard serial TDR 16 of the selected I/O unit. The address of the writeable data may be loaded at block 92 from the JTAG standard serial TDR 16 into the JTAG standard parallel TDR 18.

A run-test-idle state may be maintained until a corresponding ADDRESS VALID bit is set at block 94, once the address loading is complete. The writeable data from the function register may be loaded into the JTAG standard parallel TDR 18 interfaced via the digital logic interface shown in FIG. 1. The writeable data from the JTAG standard parallel TDR 18 may be loaded to the JTAG standard serial TDR 16.

Figure 7:
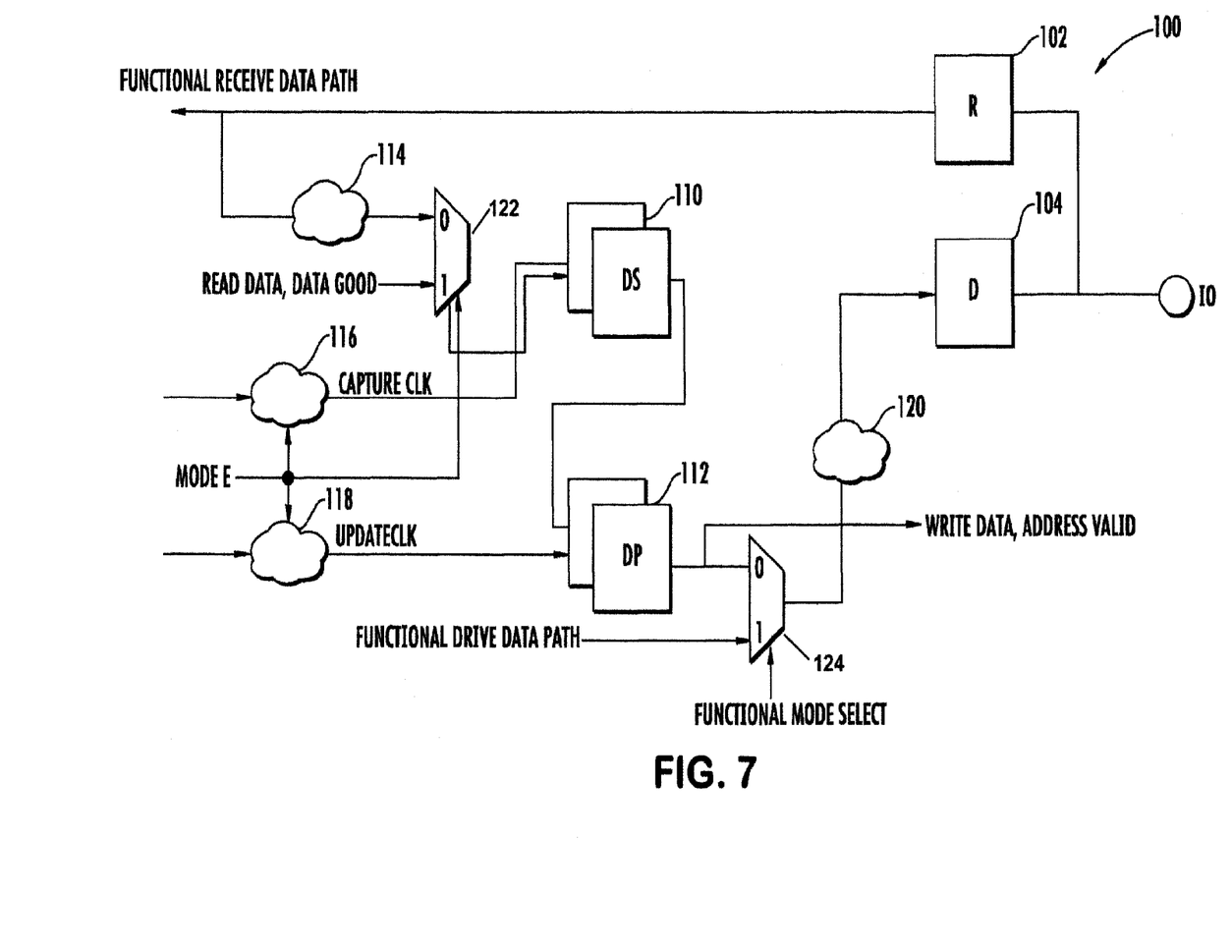
FIG. 7 is a simplified boundary scan structure that is modified in accordance to the present invention.

FIG. 7 represents a simplified standard boundary scan structure 100 with input output capability. R 102 represents a receiver, and D 104 represents a driver. ES 106 and EP 108 represent ENABLE SERIAL and ENABLE PARALLEL latches. A serial Drive latch DS 110 is followed by a parallel Drive latch DP 112. In boundary test/scan mode, data is shifted serially into serial latches such as DS 110 on a captureClk signal and then loaded into parallel latches such as DP 112 on updateCLk. This data may be used at DRIVER D 104 or wrapped back into RECEIVER R 102. During functional mode, the functional data path (both for RECEIVE R 102 and DRIVE D 104) may be used, thereby bypassing the entire boundary scan structure.

A minimum amount of logic 114, 116, 118, optionally 120, is added to modify the boundary scan structure to work with chip domain circuitry. Logic 114, 116 and 118 are built from combinational logic gates and are placed in front of serial latch 110 to multiplex between the receive data and the new READ DATA/DATA GOOD signals shown in FIG. 2. The multiplexing may be accomplished using multiplexers 122, 124.

A new mode or private instruction, shown in FIG. 7 as MODE E, is then used to select that mode of operation. The captureCLK and updateClk may be formed using this new MODE E to ensure proper operation during the mode. The new WRITE DATA/ADDRESS VALID path. from the DP latch, is accessible now from around the function mode multiplexer 124, thereby allowing access to that data at any time. This way, care is taken not to disturb any of the normal operation of the boundary scan structure. Moreover, the structure is enhanced such that it can facilitate communications between circuit components using JTAG standards.

While the present invention has been illustrated by a description of various embodiments and while these embodiments have been described in considerable detail, it is not the intention of the Applicants to restrict, or, in any way limit the scope of the appended claims to such detail. The invention in its broader aspects is therefore not limited to the specific details, representative apparatus and method, and illustrative example shown and described. Accordingly, departures may be made from such details without departing from the spirit or scope of Applicants' general inventive concept.

What is claimed is:

1. An apparatus for communicating with functional circuitry using a Joint Test Action Group standard boundary cell architecture, the apparatus comprising:
   an integrated circuit having a plurality of function registers associated with the integrated circuit's functional circuitry; and
   a plurality of Input/Output units arranged in a serial communications chain that is located around the boundary of the integrated circuit's functional circuitry, wherein each Input/Output unit comprises:
   i) at least one Joint Test Action Group standard serial test data register in serial communication with adjacent Input/Output units;
   ii) at least one Joint Test Action Group standard parallel test data register associated with and in parallel communication with the at least one Joint Test Action Group standard serial test data register; and
   iii) digital logic configured to control a direct transfer of data between the at least one Joint Test Action Group standard parallel test data register and a corresponding one of the plurality of function registers.

2. The apparatus of claim 1, wherein the at least one Joint Test Action Group standard parallel test data register includes data bits for representing data to be written or read from its associated function register.

3. The apparatus of claim 2, wherein the at least one Joint Test Action Group standard parallel test data register includes a READ/WRITE bit for indicating a direction of data flow.

4. The apparatus of claim 2, further including a DATA GOOD signal having a timing delay that is sufficient to guarantee the data represented by the data bits is stable.

5. The apparatus of claim 1, wherein the at least one Joint Test Action Group standard parallel test data register includes address bits for addressing its associated function register.

6. The apparatus of claim 5, further including an ADDRESS VALID bit for indicating the correctness of the values held by the at least one Joint Test Action Group standard parallel test data register address bits.

7. The apparatus of claim 1, further including an extended boundary scan signal that is inactive during execution of Joint Test Action Group standard instructions for maintaining IEEE 1149.1 compliance and active during execution of extended functional instructions.

8. The apparatus of claim 7, wherein the extended boundary scan signal is an inversion of a logical OR of standard boundary scan instructions.

9. A method for communicating with functional circuitry using a Joint Test Action Group standard boundary cell architecture, the method comprising:
   providing an integrated circuit having a plurality of function registers associated with the integrated circuit's functional circuitry; and
   providing a plurality of Input/Output units arranged in a serial communications chain that is located around the boundary of the integrated circuit's functional circuit, wherein each Input/Output unit comprises:
   i) at least one Joint Test Action Group standard serial test data register in serial communication with adjacent Input/Output units;
   ii) at least one Joint Test Action Group standard parallel test data register associated with and in parallel communication with the at least one Joint Test Action Group standard serial test data register; and
   iii) a digital logic interface configured to control a direct transfer of data between the at least one Joint Test Action Group standard parallel test data register and a corresponding one of the plurality of function registers.

10. The method according to claim 9, further comprising:
issuing a Joint Test Action Group instruction to select a desired one of the plurality Input/Output units;
shifting an address of readable data into the at least one Joint Test Action Group standard serial boundary scan test data register of the selected Input/Output unit;
loading the address of the readable data from the at least one Joint Test Action Group standard serial test data register into the at least one Joint Test Action Group standard parallel data register;
setting a corresponding ADDRESS VALID bit once address loading is complete;
loading the readable data from at least one function register of the plurality of function registers into the Joint Test Action Group standard serial test data register interfaced via the digital logic interface;
testing a corresponding DATA GOOD signal until the readable data in the serial test data register is valid; and
shifting the data out of the plurality of Input/Output units.

11. The method according to claim 10, further including:
clearing the ADDRESS VALID bit after the DATA GOOD signal and address bits are cleared; and
turning off the DATA GOOD signal after the ADDRESS VALID bit is cleared.

12. The method according to claim 9, further comprising:
issuing a Joint Test Action Group instruction to select a desired one of the plurality of Input/Output units;
shifting an address of writable data into the at least one Joint Test Action Group standard serial test data register of the selected Input/Output unit;
shifting the writable data into the at least Joint Test Action Group standard serial test data register of the selected Input/Output unit;
loading the address of the writable data from the at least one Joint Test Action Group standard serial test data register into the at least one Joint Test Action Group standard parallel data register;
loading the writable data from the at least one Joint Test Action Group standard serial test data register into the at least one Joint Test Action Group standard parallel data register;
setting a corresponding ADDRESS VALID bit once address loading is complete;
testing a corresponding DATA GOOD signal until the writable data in the Joint Test Action Group standard parallel test data register is valid; and
loading the writable data from the Joint Test Action Group standard parallel test data register into the at least one function register via a second digital interface logic.

13. The method according to claim 9, further including providing a Joint Test Action Group macro that orchestrates the overall communication process.

14. An apparatus, comprising:
an integrated circuit having a plurality of function registers associated with the integrated circuit's functional circuitry; and
a plurality of Input/Output units arranged in a serial communications chain that is located around the boundary of the integrated circuit's functional circuitry, wherein each Input/Output unit comprises:
i) at least one Joint Test Action Group standard serial test data register in serial communication with adjacent Input/Output units;
ii) at least one Joint Test Action Group standard parallel test data register having data bits for representing data to be written to or read from an associated one of the plurality of function registers, wherein the at least one Joint Test Action Group standard parallel test data register is associated with and in parallel communication with the at least one Joint Test Action Group standard serial test data register; and
iii) digital logic configured to control a direct transfer of data between the at least one Joint Test Action Group standard parallel test data register and a corresponding one of the plurality of function registers.

15. The apparatus of claim 14, wherein the at least one Joint Test Action Group standard parallel test data register includes a READ/WRITE bit for indicating the direction of data flow.

16. The apparatus of claim 14, further including a DATA GOOD signal having a timing delay that is sufficient to guarantee the data represented by the data bits is stable.

17. The apparatus of claim 14, wherein the at least one Joint Test Action Group standard parallel test data register includes address bits for addressing its associated function register.

18. The apparatus of claim 17, further including an ADDRESS VALID bit for indicating the correctness of the values held by the at least one Joint Test Action Group standard parallel test data register address bits.

19. The apparatus of claim 14, further including an extended boundary scan signal that is inactive during execution of Joint Test Action Group standard instructions for maintaining IEEE 1149.1 compliance and active during execution of extended functional instructions.

20. The apparatus of claim 19, wherein the extended boundary scan signal is an inversion of a logical OR of standard boundary scan instructions.

* * * * *